United States Patent
Daniels et al.

(10) Patent No.: US 10,958,226 B2
(45) Date of Patent: Mar. 23, 2021

(54) METHOD OF FORMING A SEMICONDUCTOR DEVICE AND STRUCTURE THEREFOR

(71) Applicant: SEMICONDUCTOR COMPONENTS INDUSTRIES, LLC, Phoenix, AZ (US)

(72) Inventors: Jorg Jos Daniels, Outgaarden (BE); Dieter Jozef Joos, Nieuwenrode (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 56 days.

(21) Appl. No.: 16/419,506

(22) Filed: May 22, 2019

(65) Prior Publication Data
US 2020/0266782 A1 Aug. 20, 2020

Related U.S. Application Data

(60) Provisional application No. 62/806,524, filed on Feb. 15, 2019.

(51) Int. Cl.
| H03F 1/02 | (2006.01) |
| H03F 3/45 | (2006.01) |
| H03F 3/68 | (2006.01) |
| H03F 1/34 | (2006.01) |

(52) U.S. Cl.
CPC ......... *H03F 3/45183* (2013.01); *H03F 1/342* (2013.01); *H03F 3/68* (2013.01); *H03F 2200/129* (2013.01); *H03F 2200/156* (2013.01); *H03F 2200/165* (2013.01); *H03F 2200/228* (2013.01); *H03F 2200/249* (2013.01); *H03F 2200/267* (2013.01); *H03F 2203/45116* (2013.01); *H03F 2203/45536* (2013.01)

(58) Field of Classification Search
CPC ........ H03F 3/45183; H03F 3/68; H03F 1/342; H03F 2200/165; H03F 2200/267; H03F 2200/228; H03F 2200/156; H03F 2203/45116; H03F 2203/45536; H03F 2200/249; H03F 2200/129; H03F 3/45475; H03F 1/303; H03F 3/005
USPC .......................................................... 330/9
See application file for complete search history.

(56) References Cited

U.S. PATENT DOCUMENTS

| 8,179,195 | B1 | 5/2012 | Huijsing et al. |
| 9,391,571 | B2 | 7/2016 | Stanescu |
| 9,634,617 | B2 * | 4/2017 | Ivanov ............... H03F 3/45183 |
| 2005/0179573 | A1 | 8/2005 | Oprescu |
| 2007/0170981 | A1 | 7/2007 | Burt et al. |
| 2009/0309653 | A1 | 12/2009 | Luff |

(Continued)

*Primary Examiner* — Khanh V Nguyen
(74) *Attorney, Agent, or Firm* — Robert F. Hightower (57) ABSTRACT

In an embodiment, a differential buffer may include a first input stage that compares a non-inverting portion of an input signal alternately to a non-inverting portion of an output and to an inverting portion of the output. Another embodiment of the differential buffer may also include a second input stage that compares the inverting portion of the input signal alternately to the inverting portion of the output signal and to the non-inverting portion of the output signal. Other embodiments of the differential buffer may include a feedback chopper switch that transfers the non-inverting portion of the output signal and the inverting portion of the output signal to the first input stage and to the second input stage.

20 Claims, 4 Drawing Sheets

(56) References Cited

U.S. PATENT DOCUMENTS

| | | | |
|---|---|---|---|
| 2013/0113553 A1 | 5/2013 | Hsieh | |
| 2015/0311868 A1* | 10/2015 | Wan | H03G 3/002 330/9 |
| 2017/0373655 A1* | 12/2017 | Mengad | H03F 3/393 |

* cited by examiner

METHOD OF FORMING A SEMICONDUCTOR DEVICE AND STRUCTURE THEREFOR

PRIORITY CLAIM TO PRIOR PROVISIONAL FILING

This application claims priority to prior filed Provisional Application No. 62/806,524 entitled "Chopping Technique to Reduce Kick-Back Disturbance" filed on Feb. 15, 2019, and having common inventors Daniels et al. which is hereby incorporated herein by reference

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form circuits to measure various types of input signals. Some applications used a chopper stabilized amplifier for part of the system in order to improve accuracy of the measurements. Some of the chopper stabilized amplifiers could cause changes in the input signal which often caused the circuit to delay a period of time to allow the input signal to stabilize. In some applications, the chopping had to occur at a lower frequency in order to avoid reduced accuracy in the measurements.

Accordingly, it is desirable to have a circuit or method that improves the accuracy of measuring signals, that reduces delay in measuring the signals, or that reduces disturbances of the input signal.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

The embodiments illustrated and described hereinafter may have embodiments and/or may be practiced in the absence of any element which is not specifically disclosed herein.

DETAILED DESCRIPTION OF THE DRAWINGS

Figure 1:
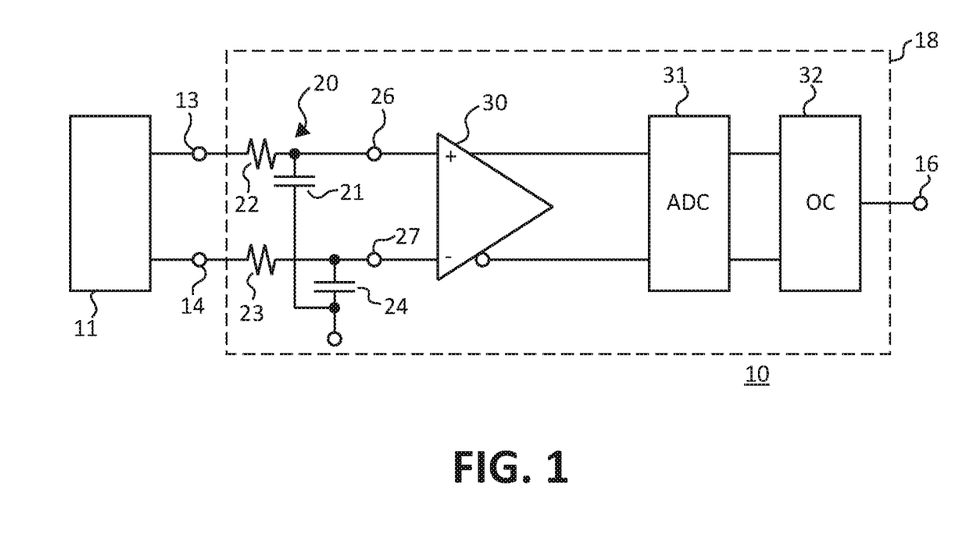
FIG. 1 schematically illustrates an example of an embodiment of a portion of a system in accordance with the present invention.

FIG. 1 schematically illustrates an example of a portion of an embodiment of a measurement system 10 that includes a measurement channel 18. System 10 receive signals to be measured from a signaling device 11. System 10 includes inputs 13 and 14 that are configured to receive a differential input signal from device 11. For example, input 13 may be configured to receive a non-inverting portion of the differential input signal and input 14 may be configured to receive an inverting portion of the differential input signal. Channel 18 may have an embodiment that is configured to receive the differential input signal and measure a value thereof.

Channel 18 may have an embodiment that includes a low pass filter 20, a differential buffer 30, an analog-to digital-conversion circuit 31, and other circuitry (OC) 32 that assists in forming an output signal on an output 16 that represents measured characteristics of the differential input signal received between inputs 13 and 14. For example, output 16 may have a digital signal that has a number of bits representing a numerical value.

An embodiment of filter 20 may include a non-inverting portion of filter 20 that may include a resistor 22 and a capacitor 21, and an inverting portion of filter 20 that may include a resistor 23 and a capacitor 24. An embodiment of filter 20 may have a cutoff frequency that is established by the values of the combination of resistor 22 and capacitor 21, and the combination of resistor 23 and capacitor 24. Filter 20 can have other embodiments such as a cascade of RC filters that may form a passive filter of a higher order.

Figure 2:
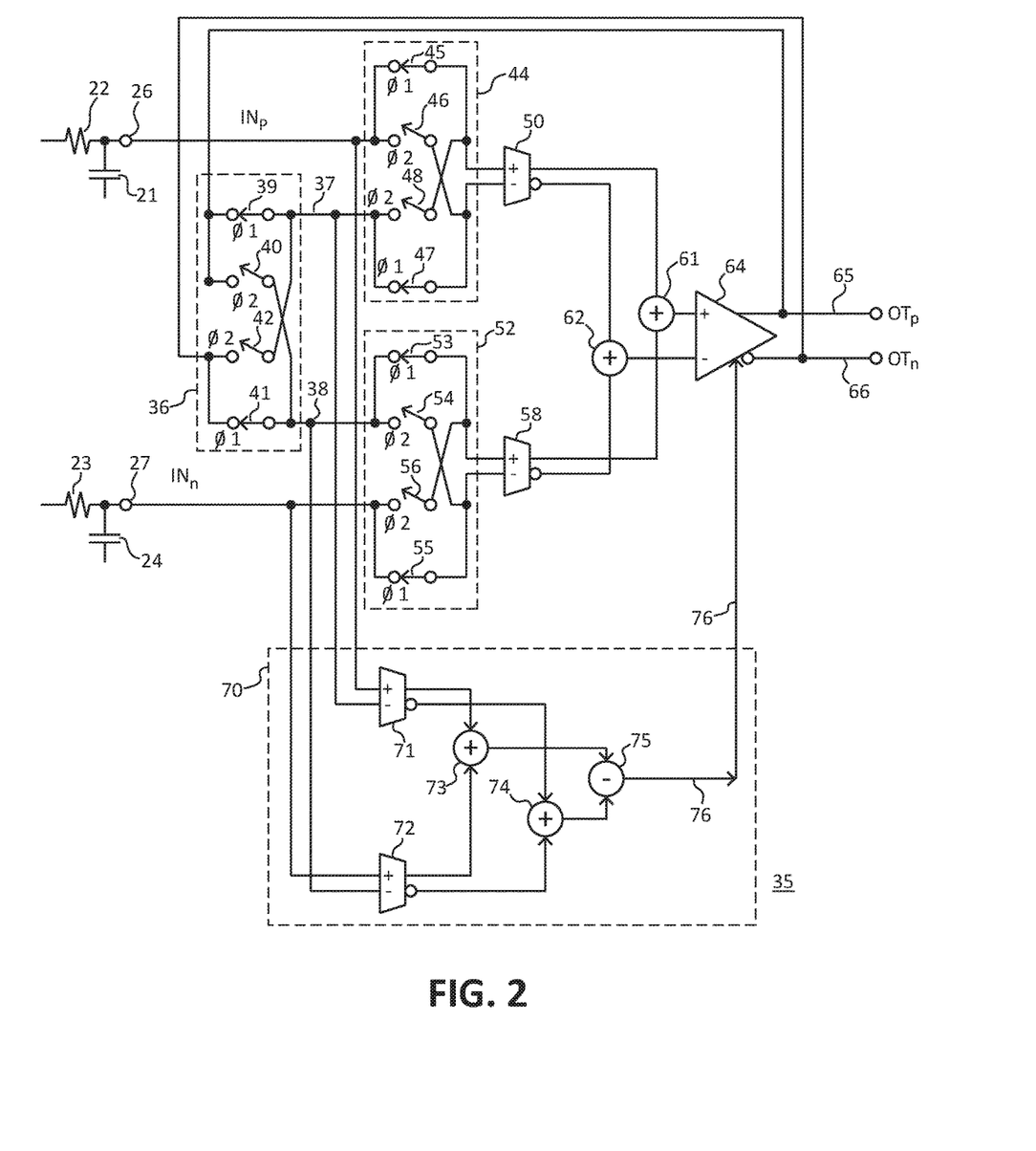
FIG. 2 schematically illustrates an example of an embodiment of a portion of a differential buffer in accordance with the present invention.

FIG. 2 schematically illustrates an example of a portion of an embodiment of a differential buffer 35 that may have an embodiment that may be an alternate embodiment of buffer 30 illustrated in FIG. 1. Buffer 35 includes non-inverting input 26 that is configured to receive the non-inverting portion (INp) of the differential input signal from filter 20 and also includes an inverting input 27 that is configured to receive the inverting portion (INn) of the differential input signal from filter 20.

Buffer 35 includes an input stage or input circuit 50, an input stage or input circuit 58, and an output stage or output circuit 64. Circuits 50 and 58 each may have embodiments that may be formed as a differential input amplifier, and output stage 64 may have an embodiment that may be formed as an output amplifier. For example, circuits 50, 58, and 64 may have embodiments of a differential pair. Buffer 35 may also include a feedback chopper switch or feedback switch 36, a positive input chopper switch or input switch 44, and a negative input chopper switch or input switch 52. An adder circuit or adder 61 and an adder circuit or adder 62 may also be included in an embodiment of buffer 35. Buffer 35 is configured to form a differential output signal that includes a non-inverting output signal (OTp) on a non-inverting output 65, and also includes an inverting output signal (OTn) on an inverting output 66. Buffer 35 is configured such that the DC gain of a signal from inputs 26 and 27 to outputs 65 and 66 is substantially unity. In some embodiments, buffer 35 may have a unity gain for frequencies that are less than the bandwidth of buffer 35.

Buffer 35 may also have an embodiment that includes a common mode regulation circuit 70 that is used to regulate the common mode portion of the output signal formed by buffer 35. Circuit 70 includes an input stage or input circuit 71, an input stage or input circuit 72, an adder circuit or adder 73, another adder circuit or adder 74, and a subtractor circuit or subtractor 75. Input stages 71 and 72 may have embodiments that may be formed as a differential input amplifier similarly to circuits 50 and 58.

Switches 36, 44, and 52 are formed as differential chopper switches that each receive a differential signal and alternately apply portions of the differential signal to different differential outputs of the switch. Thus, each of switches 36, 44, and 52 includes active or selection switches. Switch 36 includes selection switches 39-42, switch 44 includes selection switches 45-48, and switch 52 includes selection switches 53-56. The sequence of alternately applying portions of the received differential signal to different outputs of the switch is described herein as different operational states or phases. An embodiment of buffer 35 is configured to operate in two operational states or phases referred to herein as phase one and phase two. Buffer 35 is configured to selectively enable and disable the respective selection switches to transfer input signals to different outputs for each of the phase one and phase two conditions. Those skilled in the art will appreciate that the enabled and disabled states of the selection switches are controlled such that the selection switches operate with non-overlapping enabled states. Thus, there may be a short non-overlap interval between the phase one and phase two states (and another between phase two and phase one) in which all of the selection switches may be disabled or open. Those skilled in the art will understand that each of phase one and phase two may have a time interval in which certain of the selection switches are enabled or closed and others are disabled or open, these time intervals do not include the non-overlap intervals. The frequency at which the circuit changes between phase one and phase two, and vice versa, is often referred to as the chopping frequency.

Figure 3:
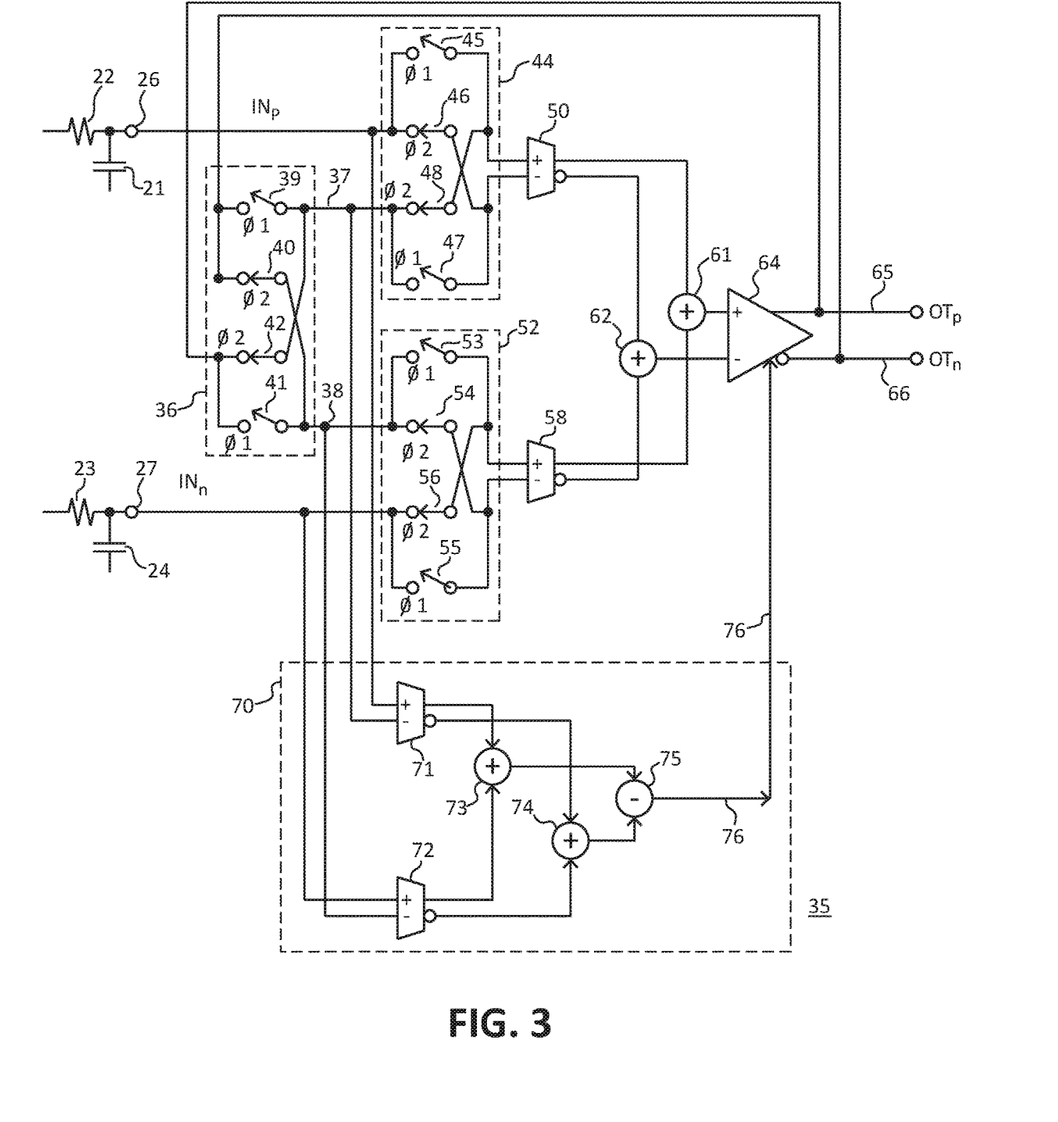
FIG. 3 schematically illustrates an example of an embodiment of a portion of another operational state of the differential buffer of FIG. 2 in accordance with the present invention.

FIG. 2 illustrates the condition of the selection switches in the phase one operational state or phase one, and FIG. 3 illustrates the condition of the selection switches in the phase two operational state or phase two.

As will be seen further hereinafter, switch 36 is configured to receive from circuit 64 the non-inverting output signal (OTp) as a first feedback signal and the inverting output signal (OTn) as a second feedback signal and to selectively transfer one of these feedback signals to circuit 50 through switch 44, and to transfer a different one of these to circuit 58 through switch 52. Also as will be seen further hereinafter, an embodiment of buffer 35 is formed such that during both phase one and phase two, circuit 50 receives the non-inverting portion (INp) of the input signal from input 26 and circuit 58 receives the inverting portion (INn) of the input signal from input 27. Also as will be seen further hereinafter, an embodiment of buffer 35 is formed such that during phase one circuit 50 receives either a first one of the non-inverting output (OTp) signal or the inverting output (OTn) signal from circuit 64, and circuit 58 receives an opposite one of the non-inverting or inverting output signal from circuit 64; and during phase two circuit 50 receives the opposite one of the non-inverting or inverting output signal while circuit 58 receives the first one of the non-inverting output signal or the inverting output signal from circuit 64.

Referring to FIG. 2 as illustrating an example of an embodiment of phase one, buffer 35 is configured to selectively enable circuit 44 to transfer the non-inverting input (INp) signal from input 26 to a non-inverting input of circuit 50. For example, buffer 35 may be configured to selectively enable switch 45 and disable switch 46 to facilitate this transfer. Circuit 36 is also selectively enabled to transfer the non-inverting output signal (OTp) of amplifier 64 to circuit 44, and circuit 44 is selectively enabled to transfer the non-inverting output (OTp) signal to the inverting input of circuit 50. Thus, switch 39 is selectively enabled and switch 40 is selectively disabled and switch 47 is selectively enabled and switch 48 is selectively disabled to facilitate the transfer to the inverting input of circuit 50.

Buffer 35 is also configured to selectively enable circuit 52 to transfer the inverting input signal (INn) from input 27 to an inverting input of circuit 58. Thus, switch 55 is selectively enabled and switch 56 is selectively disabled by buffer 35 to facilitate this transfer. Additionally, circuit 36 is selectively enabled to transfer the inverting output (OTn) signal to circuit 52, and circuit 52 is selectively enabled to transfer the inverting output (OTn) signal to the non-inverting input of circuit 58. Thus, switch 41 is selectively enabled and switch 42 is selectively disable, and switch 53 is selectively enabled and switch 54 is selectively disabled to facilitate the transfer to the non-inverting input of circuit 58.

Circuit 50 receives the non-inverting input signal (INp) and the non-inverting output signal (OTp) and forms a differential output signal 51. Circuit 58 receives the inverting input signal (INn) and the inverting output signal (OTn) and forms a differential output signal 59. Adder 61 receives the non-inverting portion of output signal 51 from circuit 50 and a non-inverting portion of output signal 59 from circuit 58, sums the two signals together, and applies the resulting signal to a non-inverting input of circuit 64. Similarly, adder 62 receives the inverting portion of output signal 51 from circuit 50 and the inverting portion of output signal 59 from circuit 58, sums the two signals together, and applies the resulting signal to an inverting input of circuit 64.

During phase one, circuit 71 receives the positive input (INp) signal and the same signal from circuit 64 that is received by circuit 50, and forms a differential output signal. Circuit 72 receives the inverting input (INn) signal and the same signal from circuit 64 that is received by circuit 58, and forms another differential output signal. In an embodiment, circuit 72 receives the opposite polarity of the signals received by circuit 58 during phase 1, and circuit 71 receives the opposite polarity of the signals received by circuit 50 during phase 2. Adder 73 receives the non-inverting portion of the output signals from circuits 71 and 72, sums them together and forms a first result signal; and adder 74 receives the inverting portion of the output signals from circuits 71 in 72, sums them together and forms a second result signal. Subtractor 75 receives the two result signals and subtracts them to form a common mode control signal 76. An embodiment may include that subtractor 75 subtracts the first result signal from adder 73 from the second result signal from adder 74, to form signal 76. Signal 76 is a control signal used to regulate the common mode voltage from circuit 64.

Referring to FIG. 3 as illustrating an example of an embodiment of phase two, buffer 35 is configured to selectively enable circuit 44 to transfer the non-inverting input (INp) signal from input 26 to an inverting input of circuit 50. Thus, buffer 35 is configured to selectively disable switch 45 and enable switch 46 to facilitate this transfer. Also, circuit 36 is selectively enabled to transfer the inverting output (OTn) signal to circuit 44, and circuit 44 is selectively enabled to transfer the inverting output (OTn) signal to the non-inverting input of circuit 50. Thus, switch 42 is selectively enabled and switch 41 is selectively disabled, while switch 47 is selectively disabled and switch 48 is selectively enabled to facilitate the transfer to the non-inverting input of circuit 50.

Buffer 35 is also configured to selectively enable circuit 52 to transfer the inverting input (INn) signal from input 27 to the non-inverting input of circuit 58. Thus, switch 56 is selectively enabled and switch 55 is selectively disabled to facilitate this transfer. Additionally, circuit 36 is selectively enabled to transfer the non-inverting output (OTp) signal to circuit 52, and circuit 52 is selectively enabled to transfer the non-inverting output signal to the inverting input of circuit 58. Thus, switch 40 is selectively enabled and switch 39 is selectively disabled, and switch 54 is selectively enabled and switch 53 is selectively disabled to facilitate the transfer to the inverting input of circuit 58.

Circuit 50 receives the non-inverting input (INp) signal and the inverting output (OTn) signal and forms differential output signal 51. Circuit 58 receives the inverting input (INn) signal and the non-inverting output (OTp) signal and forms differential output signal 59. As before, adder 61 receives the non-inverting portion of output signals 51 and 59 from respective circuits 50 and 58, sums the two signals together, and applies the resulting signal to the non-inverting output of circuit 64. Adder 62 receives the inverting portion of output signals 51 and 59 from respective circuits 50 and 58, sums the two signals together, and applies the resulting signal to the inverting input of circuit 64. Adders 61 and 62 facilitate combining two differential signals to form one differential signal that can be an input to amplifier 64. Adders 61 and 62 also facilitate summing the signals together inside of buffer 35, and can also avoid the use of external resistors. An embodiment of adders 61 and 62 form a steady current that is added to or subtracted from the current into amplifier 64.

During phase two, circuit 71 receives the positive input (INp) signal and the same signal from circuit 64 that is received by circuit 50, and forms the differential output signal. Circuit 72 receives the inverting input (INn) signal and the same signal from circuit 64 that is received by circuit 58, and forms another differential output signal. Adder 73 receives the non-inverting portion of the output signals from circuits 71 and 72, sums them together and forms a first result signal; and adder 74 receives the inverting portion of the output signals from circuits 71 and 72, sums them together and forms a second result signal. Subtractor 75 receives the two result signals and subtracts them to form the common mode signal 76.

As can be seen from the operation explained for the circuit configurations of FIGS. 2-3, because of the chopping configurations provided by switches 36, 44, and 52, and the substantially unity gain, and alternately the common mode regulation circuit 70, the differential output signals from circuit 64, or alternately the feedback signals from circuit 36, is substantially the same value as the differential input signal received between inputs 26 and 27. Consequently, buffer 35 substantially does not disturb or affect the value of the differential input signal. For example, does not cause a substantial change in the value of the input signal such as for example during the transition from phase one to phase two, and vice versa. Because the input signal is not disturbed, the time required for the differential output signal to settle to the correct value is greatly reduced. The condition of the output signal affecting the input signal is sometimes referred to as "kickback".

Additionally, buffer 35 alternately compares the non-inverting output (OTp) signal and the inverting output (OTn) signal with the non-inverting input (INp) signal and the inverting input (INn) signal. Thus, one skilled in the art will understand that this operation compensates for any offset that buffer 35 may introduce and substantially removes the offset from the differential output signal formed by the non-inverting (OTp) and inverting output (OTn) signals. An embodiment may include that only a slight disturbance may be introduced into the differential input signal, such as for example due to an offset in circuits 50 and 58. However, the value of the disturbance is significantly less than the value of the offsets because it is capacitively divided between the capacitance of capacitors 21 and 24, and the parasitic input capacitance of the inputs of circuits 50 and 58. Since the capacitance of capacitors 21 and 24 is much greater than the parasitic input capacitance of circuits 50 and 58, the signal coupled to the differential input signal is substantially negligible. Thus, the settling time is reduced even further.

Additionally, because the settling time is reduced, the frequency that is used to selectively operate switches 36, 44, and 52 can be increased for a given value of capacitors 21 and 24. For example, in one embodiment, the chopping frequency used for the phase one and phase two operation was greater than the cutoff frequency of low pass filter 20 (FIG. 1). Using a higher chopping frequency for a given cutoff frequency of the low pass filter results in removing more intrinsic noise from the differential buffer. Additionally, for a given chopping frequency, a lower cutoff frequency can be used which results in improved filtering of extrinsic noise.

In order to assist in providing the herein described functionality, input 26 is commonly connected to a first input of circuit 44 and to a non-inverting input of circuit 71. An embodiment may include that input 26 is configured to be coupled to a first RC filter wherein input 26 may be configured to be commonly coupled to a first terminal of a first capacitor 21 and to a first terminal of a first resistor 22. A second terminal of resistor 22 may be coupled to receive a first portion of the differential signal. A second terminal of capacitor 21 may be coupled to a common reference voltage such as ground for example. The first input of circuit 44 is commonly connected to a first terminal of switch 45 and to a first terminal of switch 46. A second terminal of switch 45 is commonly connected to a first terminal of switch 48 and the non-inverting input of circuit 50. The inverting input of circuit 50 is commonly connected to a second terminal of switch 46 and to a first terminal of switch 47. A second terminal of switch 47 is commonly connected to a second terminal of switch 48, to the inverting input of circuit 70 and to a node 37. Node 37 is commonly connected to a first terminal of switch 39 and to a first terminal of switch 42. Input 27 is commonly connected to the non-inverting input of circuit 72, a first terminal of switch 56, and a first terminal of switch 55. An embodiment may include that input 27 is configured to be coupled to a second RC filter wherein input 27 may be configured to be commonly coupled to a first terminal of a second capacitor 24 and to a first terminal of a second resistor 23. A second terminal of resistor 23 may be coupled to receive a second portion of the differential signal. A second terminal of capacitor 24 may be coupled to a common reference voltage such as ground for example. A second terminal of switch 55 is commonly connected to a first terminal of switch 54 and to the inverting input of circuit 58. A second terminal of switch 56 is commonly connected to the non-inverting input of circuit 58 and to a first terminal of switch 53. A second terminal of switch 53 is commonly connected to a second terminal of switch 54 and to a node 38. Node 38 is commonly connected to the inverting input of circuit 72, to a first terminal of switch 41 and to the first terminal of switch 40. The non-inverting output of circuit 50 is connected to a first input of adder 61, and the inverting output of circuit 50 is connected to a first input of adder 62. A second input of adder 62 is connected to the inverting output of circuit 58. A second input of adder 61 is connected to the non-inverting output of circuit 58. The output of adder 61 is connected to the non-inverting input of circuit 64, and the output of adder 62 is connected to the inverting input of circuit 64. The non-inverting output of circuit 64 is commonly connected to output 65, a second terminal of switch 39, and a second terminal of switch 40. The inverting output of circuit 64 is commonly connected to output 66, a second terminal of switch 42, and a second terminal of switch 41. Circuit 71 has a non-inverting output connected to a first input of adder 73, and has an inverting output connected to a first input of adder 74. Circuit 72 has a non-inverting output connected to a second input terminal of adder 73, and has an inverting output connected to a second input terminal of adder 74. Adder 74 has an output connected to a first input of subtractor 75 which has a second input connected to an output of adder 73. An output of subtractor 75 is connected to a common mode control input of amplifier 64.

Figure 4:
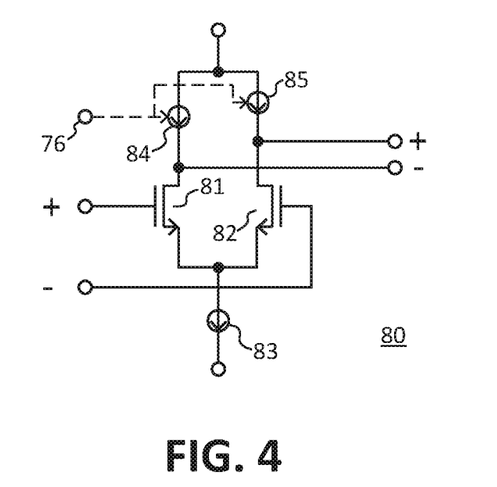
FIG. 4 schematically illustrates an example of a portion of an embodiment of a differential amplifier in accordance with the present invention.

FIG. 4 schematically illustrates an example of a portion of an embodiment of a differential amplifier 80 that may have an embodiment that may be an alternate embodiment of any one of circuits 50, 58, 64, or 71-72 (FIGS. 2-3). Amplifier 80 includes transistors 81 and 82 that are configured as a differential pair. A common current source 83 is configured to conduct the sum of the currents that flow through transistors 81 and 82. A current source 84 is connected to form a bias current that flows through transistor 81, and a current source 85 is connected to form a bias current that flows through transistor 82.

An embodiment of amplifier 80 may optionally include that sources 84 and 85 may be variable current sources. For example, current source 84 and 85 may be configured to vary the amount of bias current supplied to transistors 81 and 82 in response to the common mode signal 76 from circuit 70 (FIGS. 2-3). Those skilled in the art will appreciate that circuits 50, 58, 64, or 71-72 (FIGS. 2-3) may have other embodiments in addition to the embodiment of amplifier 80.

In order to assist in providing the functionality described herein, a gate of transistor 81 may be connected to receive the non-inverting portion of a differential input signal, such as for example the signal received by circuits 50, 58, 64, or 71-72 and the gate of transistor 82 may be configured to receive the inverting portion of the differential input signal. A source of transistor 81 may be commonly connected to the source of transistor 82 and to a first terminal of current source 83. A second terminal of source 83 may be connected to a common return voltage, such as for example a ground reference voltage. A drain of transistor 81 may be commonly connected to an inverting output of circuit 80 and to a first terminal of current source 84. A second terminal of current source 84 may be commonly connected to a first terminal of current source 85 and to a source of operating voltage or operating power for the circuits, such as for example a power supply voltage. A second terminal of current source 85 may be commonly connected to a drain of transistor 82 and to a non-inverting output of circuit 80. Current source 84 may optionally have an optional control input that is commonly connected an optional control input of current source 85 and to receive signal 76.

Figure 5:
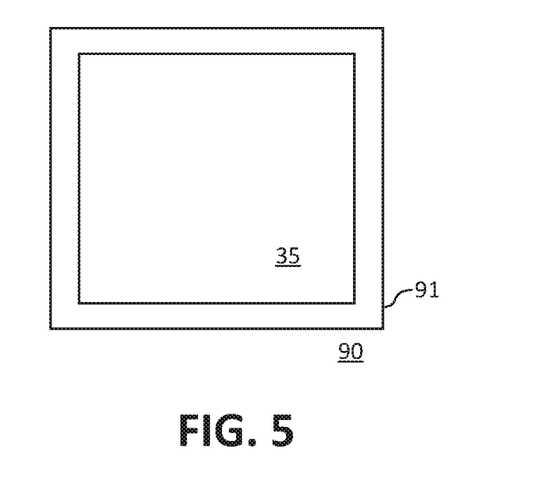
FIG. 5 illustrates an enlarged plan view of a semiconductor device that includes the differential buffer of FIG. 1 or 2 in accordance with the present invention.

FIG. 5 illustrates an enlarged plan view of a portion of an embodiment of a semiconductor device or integrated circuit 90 that is formed on a semiconductor die 91. In an embodiment, buffers 30 or 35, or channel 18 may be formed on die 91. Die 91 may also include other circuits that are not shown in FIG. 5 for simplicity of the drawing. Device or integrated circuit 90 may be formed on die 91 by semiconductor manufacturing techniques that are well known to those skilled in the art.

From all the foregoing, one skilled in the art will appreciate that an example of an embodiment of a differential buffer may comprise:

a first differential input amplifier, such as for example amplifier 50, configured to receive both a non-inverting portion of a differential input signal, such as for example signal INp, and a first switch signal and form an output signal that includes a first non-inverting output and a first inverting output;

a second differential input amplifier, such as for example amplifier 58, configured to receive both an inverting portion of the differential input signal, such as for example signal INn, and a second switch signal and form another output signal that includes a second non-inverting output and a second inverting output an output amplifier, such as for example amplifier 64, having a non-inverting input coupled to receive a first signal that is representative of a sum of the first non-inverting output and the second non-inverting output, the output amplifier having an inverting input coupled to receive a second signal that is representative of a sum of the first inverting output and the second inverting output, the output amplifier configured to form a differential output signal responsively to the first signal and the second signal wherein the differential output signal includes a non-inverting output signal and an inverting output signal;

a feedback chopper switch, such as for example circuit 36, configured to receive the non-inverting output signal and the inverting output signal;

a positive input chopper switch, such as for example circuit 44, configured to selectively form the first switch signal for a first time interval as one of the non-inverting output signal or the inverting output signal, and to selectively form the first switch signal for a second time interval as a different one of the non-inverting output signal or the inverting output signal; and a negative input chopper switch, such as for example circuit 52, configured to selectively form the second switch signal for the first time interval as an opposite one of the non-inverting output signal or the inverting output signal than was used as the first switch signal for the first time interval, and to selectively form the second switch signal for the second time interval as an opposite one of the non-inverting output signal or the inverting output signal than was used for the first switch signal for the second time interval.

An embodiment of the differential buffer may include that the positive input chopper switch may have a first input configured to receive the non-inverting portion of the differential input signal, and has a second input connected to a first output of the feedback chopper switch to receive the first switch signal from the feedback chopper switch.

In an embodiment, the negative input chopper switch may have a first input configured to receive the inverting portion of the differential input signal, and may have a second input connected to a second output of the feedback chopper switch to receive the second switch signal.

An embodiment may include that the feedback chopper switch may have a first input connected to a non-inverting output of the output amplifier, and may have a second input connected to an inverting output of the output amplifier.

Another embodiment may include a first adder having a first input connected to the first non-inverting output of the first differential input amplifier, a second input connected to the second non-inverting output of the second differential amplifier, and an output connected to the non-inverting input of the output amplifier.

An embodiment may include a second adder having a first input connected to the first inverting output of the first differential input amplifier, a second input connected to the second inverting output of the second differential input amplifier, and an output connected to the inverting input of the output amplifier.

In an embodiment, the positive input chopper switch may receive the non-inverting output signal from the feedback chopper switch during the first time interval and may receive the inverting output signal from the feedback chopper switch during the second time interval.

An embodiment may include that the negative input chopper switch may receive the inverting output signal from the feedback chopper switch during the first time interval and may receive the non-inverting output signal from the feedback chopper switch during a second time interval.

An embodiment may include that the positive input chopper switch has a first output directly connected to a first input of the first differential input amplifier, has a second output directly connected to a second input of the first differential input amplifier, and is not connected to the second differential input amplifier.

Another embodiment may include that the negative input chopper switch may have a first output directly connected to a first input of the second differential input amplifier, may have a second output directly connected to a second input of the second differential input amplifier, and may not be connected to the first differential input amplifier.

Those skilled in the art will also appreciate that an example of an embodiment of a semiconductor device having a differential buffer may comprise:

a first input stage, such as for example circuit 50, having a first input and a second input;

a second input stage, such as for example circuit 58, having a third input and a fourth input;

an output stage, such as for example circuit 64, configured to receive signals from both the first input stage and the second input stage and to responsively form a non-inverting output signal, such as for example signal OTp, and an inverting output signal, such as for example signal OTn;

a feedback switch, such as for example circuit 36, configured to receive the non-inverting output signal and the inverting output signal, the feedback switch configured to alternatingly apply one of the non-inverting output signal or the inverting output signal to a first output, such as for example node 37, as a first switch signal for a first time interval and a second time interval, the feedback switch configured to alternatingly apply an opposite one of the non-inverting output signal or the inverting output signal to a second output, such as for example node 38, as a second switch signal for the first time interval and the second time interval;

a first switch, such as for example circuit 44, configured to receive a non-inverting portion of a differential input signal, such as for example signal INp, the first switch configured to apply the first signal and the non-inverting portion of the differential input signal to the first input stage, such as for example circuit 44, for the first and second time intervals; and a second switch, such as for example circuit 52, configured to receive an inverting portion, such as for example signal INn, of the differential input signal, the second switch configured to apply the second switch signal and the inverting portion of the differential input signal to the second input stage (58) for the first and second time intervals.

In an embodiment, the semiconductor device may also include a non-inverting input configured to receive a sum of a non-inverting output of the first input stage and a non-inverting output of the second input stage, the output stage also including an inverting input configured to receive a sum of an inverting output of the first input stage and an inverting output of the second input stage.

Another embodiment may include that the first input stage does not receive the inverting portion of the differential input signal.

An embodiment may include that the first input stage receives the non-inverting portion of the differential input signal from the first switch on the first input for the first time interval and receives the non-inverting portion of the differential input signal from the first switch on the second input for the second time interval.

Those skilled in the art will also appreciate that an example of an embodiment of a method of forming a differential buffer may comprise:

configuring a first input stage, such as for example circuit 50, to receive a first one of a non-inverting output, such as for example signal OTp, of an output stage or an inverting output, such as for example signal OTn, of the output stage for a first time interval and to receive an opposite one of the non-inverting output or the inverting output for a second time interval wherein the first input stage receives a non-inverting portion, such as for example signal INp, of a differential input signal for the first time interval and for the second time interval; and configuring a second input stage, such as for example circuit 58, to receive the opposite one of the non-inverting output or the inverting output for the first time interval and to receive the first one of the non-inverting output or the inverting output for the second time interval wherein the second input stage receives an inverting portion of the differential input signal for the first time interval and for the second time interval.

An embodiment of the method may also include configuring a feedback switch, such as for example circuit 36, to receive the non-inverting output and the inverting output and to transfer the first one of the non-inverting output or the inverting output to the first input stage during the first time, such as for example phase one, interval and to transfer the opposite one of the non-inverting output or the inverting output to the second input stage during the first time interval.

The method may also have an embodiment that may include configuring the feedback switch to transfer the opposite one of the non-inverting output or the inverting output to the first input stage during a second time interval, such as for example phase two, and to transfer the first one of the non-inverting output or the inverting output to the second input stage during the second time interval.

An embodiment may include configuring a first switch, such as for example circuit 44, to apply the non-inverting portion of the differential input signal to the first input stage for both the first time interval and the second time interval while applying the non-inverting output to the first input stage during the first time interval and applying the inverting output to the input stage during the second time interval.

An embodiment may include configuring the output stage to simultaneously receive an output from the first input stage and the second input stage on a first input for the first time interval and for the second time interval.

Another embodiment may include configuring the differential buffer to be proceeded by an RC filter wherein a cutoff frequency of the RC filter is less than a chopping frequency of the differential buffer.

Those skilled in the art will also appreciate that an example of an embodiment of a method of forming a differential buffer may comprise:

configuring the differential buffer as a chopper buffer that operates at a chopping frequency;

coupling an RC filter proceeding the differential buffer wherein a cutoff frequency of the RC filter is lower that the chopping frequency.

Another embodiment may include configuring the output stage to receive signals from the first input stage and from the second input stage without a chopper switch interposed between outputs of the first input stage and inputs of the output stage.

In view of all of the above, it is evident that a novel device and method is disclosed. Included, among other features, is forming a differential buffer that has a reduced settling time. The differential buffer includes the first input stage that compares the non-inverting portion of an input signal alternately to a non-inverting portion of the output and to an inverting portion of the output. The differential buffer also includes a second input stage that compares the inverting portion of the input signal alternately to the inverting portion of the output signal and to the non-inverting portion of the output signal. An embodiment includes a feedback chopper switch that transfers the non-inverting portion of the output signal and the inverting portion of the output signal to the first input stage and to the second input stage. An embodiment of the differential buffer is formed such that there is not a chopper stage between outputs of the two input stages and inputs of the output amplifier stage.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A differential buffer comprising:
   a first differential input amplifier configured to receive both a non-inverting portion of a differential input signal and a first switch signal and form an output signal that includes a first non-inverting output and a first inverting output;
   a second differential input amplifier configured to receive both an inverting portion of the differential input signal and a second switch signal and form another output signal that includes a second non-inverting output and a second inverting output
   an output amplifier having a non-inverting input coupled to receive a first signal that is representative of a sum of the first non-inverting output and the second non-inverting output, the output amplifier having an inverting input coupled to receive a second signal that is representative of a sum of the first inverting output and the second inverting output, the output amplifier configured to form a differential output signal responsively to the first signal and the second signal wherein the differential output signal includes a non-inverting output signal and an inverting output signal;
a feedback chopper switch configured to receive the non-inverting output signal and the inverting output signal;
a positive input chopper switch configured to selectively form the first switch signal for a first time interval as one of the non-inverting output signal or the inverting output signal, and to selectively form the first switch signal for a second time interval as a different one of the non-inverting output signal or the inverting output signal; and
a negative input chopper switch configured to selectively form the second switch signal for the first time interval as an opposite one of the non-inverting output signal or the inverting output signal than was used as the first switch signal for the first time interval, and to selectively form the second switch signal for the second time interval as an opposite one of the non-inverting output signal or the inverting output signal than was used for the first switch signal for the second time interval.

2. The differential buffer of claim 1 wherein the positive input chopper switch has a first input configured to receive the non-inverting portion of the differential input signal, and has a second input connected to a first output of the feedback chopper switch to receive the first switch signal from the feedback chopper switch, the first input of the positive chopper switch configured to be coupled to a first RC filter.

3. The differential buffer of claim 2 wherein the negative input chopper switch has a first input configured to receive the inverting portion of the differential input signal, and has a second input connected to a second output of the feedback chopper switch to receive the second switch signal, the first input of the negative chopper switch configured to be coupled to a second RC filter.

4. The differential buffer of claim 3 wherein the feedback chopper switch has a first input connected to a non-inverting output of the output amplifier, and has a second input connected to an inverting output of the output amplifier.

5. The differential buffer of claim 1 further including a first adder having a first input connected to the first non-inverting output of the first differential input amplifier, a second input connected to the second non-inverting output of the second differential amplifier, and an output connected to the non-inverting input of the output amplifier.

6. The differential buffer of claim 5 further including a second adder having a first input connected to the first inverting output of the first differential input amplifier, a second input connected to the second inverting output of the second differential input amplifier, and an output connected to the inverting input of the output amplifier.

7. The differential buffer of claim 1 wherein the positive input chopper switch receives the non-inverting output signal from the feedback chopper switch during the first time interval and receives the inverting output signal from the feedback chopper switch during the second time interval.

8. The differential buffer of claim 7 wherein the negative input chopper switch receives the inverting output signal from the feedback chopper switch during the first time interval and receives the non-inverting output signal from the feedback chopper switch during a second time interval.

9. The differential buffer of claim 1 wherein the positive input chopper switch has a first output directly connected to a first input of the first differential input amplifier, has a second output directly connected to a second input of the first differential input amplifier, and is not connected to the second differential input amplifier.

10. The differential buffer of claim 1 wherein the negative input chopper switch has a first output directly connected to a first input of the second differential input amplifier, has a second output directly connected to a second input of the second differential input amplifier, and is not connected to the first differential input amplifier.

11. A semiconductor device having a differential buffer comprising:
a first input stage having a first input and a second input;
a second input stage having a third input and a fourth input;
an output stage configured to receive signals from both the first input stage and the second input stage and to responsively form a non-inverting output signal and an inverting output signal;
a feedback switch configured to receive the non-inverting output signal and the inverting output signal, the feedback switch configured to alternatingly apply one of the non-inverting output signal or the inverting output signal to a first output as a first switch signal for a first time interval and a second time interval, the feedback switch configured to alternatingly apply an opposite one of the non-inverting output signal or the inverting output signal to a second output as a second switch signal for the first time interval and the second time interval;
a first switch configured to receive a non-inverting portion of a differential input signal, the first switch configured to apply the first signal and the non-inverting portion of the differential input signal to the first input stage for the first and second time intervals; and
a second switch configured to receive an inverting portion of the differential input signal, the second switch configured to apply the second switch signal and the inverting portion of the differential input signal to the second input stage for the first and second time intervals.

12. The semiconductor device of claim 11 wherein the output stage includes a non-inverting input configured to receive a sum of a non-inverting output of the first input stage and a non-inverting output of the second input stage, the output stage also including an inverting input configured to receive a sum of an inverting output of the first input stage and an inverting output of the second input stage.

13. The semiconductor device of claim 11 wherein the first input stage does not receive the inverting portion of the differential input signal.

14. The semiconductor device of claim 11 wherein the first input stage receives the non-inverting portion of the differential input signal from the first switch on the first input for the first time interval and receives the non-inverting portion of the differential input signal from the first switch on the second input for the second time interval.

15. A method of forming a differential buffer comprising:
configuring the differential buffer as a chopper differential buffer that operates at a chopping frequency;
configuring a first input stage of the chopper differential buffer to receive a non-inverting output of the chopper differential buffer for a first time interval and to receive an inverting output of the chopper differential buffer for a second time interval;
configuring a second input stage of the chopper differential buffer to receive the inverting output of the chopper differential buffer for the first time interval and to receive the non-inverting output of the chopper differential buffer for the second time interval; and coupling an RC filter proceeding the chopper differential buffer wherein a cutoff frequency of the RC filter is lower that the chopping frequency.

16. The method of claim 15 further including configuring the first input stage to receive a non-inverting portion of a differential input signal for the first time interval and for the second time interval; and configuring the second input stage to receive an inverting portion of the differential input signal for the first time interval and for the second time interval.

17. The method of claim 16 further including configuring a feedback switch to receive the non-inverting output and the inverting output and to transfer the non inverting output to the first input stage during the first time interval and to transfer the inverting output to the second input stage during the first time interval.

18. The method of claim 17 further including configuring the feedback switch to transfer the inverting output to the first input stage during the second time interval and to transfer non-inverting output to the second input stage during the second time interval.

19. The method of claim 16 further including configuring a first switch to apply the non-inverting portion of the differential input signal to the first input stage for both the first time interval and the second time interval while applying the non-inverting output to the first input stage during the first time interval and applying the inverting output to the input stage during the second time interval.

20. The method of claim 15 further including configuring an output stage to receive signals from the first input stage and from the second input stage without a chopper switch interposed between outputs of the first input stage and inputs of the output stage.

* * * * *